(12) United States Patent
Kenington

(10) Patent No.: US 6,819,171 B2
(45) Date of Patent: Nov. 16, 2004

(54) AMPLIFIER ARRANGEMENT

(75) Inventor: Peter Kenington, Chepstow (GB)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 10/203,505

(22) PCT Filed: Jan. 29, 2001

(86) PCT No.: PCT/GB01/00352
§ 371 (c)(1),
(2), (4) Date: Nov. 26, 2002

(87) PCT Pub. No.: WO01/59923
PCT Pub. Date: Aug. 16, 2001

(65) Prior Publication Data
US 2003/0132800 A1 Jul. 17, 2003

(30) Foreign Application Priority Data
Feb. 8, 2000 (GB) .............................. 0002847

(51) Int. Cl.⁷ ................................................. H03F 1/14
(52) U.S. Cl. ..................... 330/51; 330/295; 330/124 D; 330/124 R
(58) Field of Search .................. 330/124 R, 124 D, 330/51, 295; 114/20.1

(56) References Cited
U.S. PATENT DOCUMENTS 3,325,778 A * 6/1967 Ballard .................. 330/124 R
3,884,170 A * 5/1975 Jensen ....................... 114/20.1
5,304,943 A 4/1994 Koontz
5,872,481 A 2/1999 Camarillo, et al.
5,886,573 A 3/1999 Kolanek

FOREIGN PATENT DOCUMENTS

EP 0 725 478 8/1996
JP 60-63517 * 4/1985
WO WO 97 41642 11/1997

* cited by examiner

Primary Examiner—Michael B. Shingleton
(74) Attorney, Agent, or Firm—Steve Mendelsohn (57) ABSTRACT

Limiting amplifier (116) removes amplitude variations from the input signal (110). Splitter (120) provides the constant amplitude signal to each of amplifiers (124A to 124H) via a respective switch (122A to 122H). The envelope of the input signal (110) is detected at (134) and digitized at (138). The bits of the digitized envelope signal are used to control switches (122A to 122H). The output ratings of amplifiers (124A to 124H) form a series wherein each successive output rating is twice the preceding one. Thus, the bits of the digitized envelope signal can be used to reconstruct the envelope of the output signal provided by combiner (126). Several of the amplifiers may be replaced by a single amplifier to simplify the circuit (210, FIGS. 2 and 3). The input signal may be digital removing the need for envelope detection (FIG. 4). Errors in the output may be compensated using a feedback mechanism (FIGS. 5 and 6).

27 Claims, 6 Drawing Sheets

AMPLIFIER ARRANGEMENT

FIELD OF THE INVENTION

This invention relates to methods and apparatus for amplifying signals. More particularly, this invention relates to amplifying signals using an arrangement of multiple amplifiers.

BACKGROUND OF THE INVENTION

It is known to use highly non-linear power amplifiers in combination to create a linear amplifier. The aim is usually to create a very high efficiency linear amplifier, based on the high efficiency of the non-linear power amplifiers (e.g. class C, D or E).

One such technique is called LINC (linear amplification using non-linear components). This technique converts the desired amplitude and phase modulated signal into two constant-envelope phase-modulated signals. The key property of these signals is that when they are summed, the result is the desired amplitude and phase modulated carrier.

A major disadvantage of the technique results from this summation process in that the wanted aspects of the signals add, but the unwanted aspects subtract and this part of the signal energy is wasted by being dissipated in the load attached to the summing device (e.g. a hybrid combiner). Thus, even with perfect (100% efficient) power amplifiers, the resulting LINC system efficiency will only be 50% (for a standard two-tone test with equal tone amplitudes). With practical amplifiers (e.g. class-C operating at 60% efficiency), this figure can reduce to 30% overall efficiency, which, although better than an equivalent class-A amplifier, is still not particularly good. With high peak-to-mean signals (e.g. CDMA), this figure reduces still further.

Another known technique is LIST (linear amplification using sampling techniques). In this case, delta-modulated signals are amplified and combined in quadrature to produce the desired output signal. Cancellation at the output is required to remove image signals and not unwanted adjacent channel energy. The resulting effect on efficiency is, however, the same.

SUMMARY OF THE INVENTION

It is an object of the present invention to provide an amplification technique of improved linearity and/or efficiency.

According to a first aspect, the invention provides apparatus for amplifying an input signal to produce an output signal, the apparatus comprising splitting means for providing the input signal to each of a plurality of selectable amplifiers via a respective switch, control means for controlling the operation of the switches according to the envelope of the input signal, and a combiner for combining the selectable amplifier outputs.

According to a second aspect, the invention provides a method of amplifying an input signal to produce an output signal, the method comprising providing the input signal to each of a plurality of selectable amplifiers via a respective switch, controlling the operation of the switches according to the envelope of the input signal, and combining the selectable amplifier outputs.

In this amplification scheme, the switches can be used to bring the selectable amplifiers into operation as necessary to achieve a desired gain. This scheme also permits the selectable amplifiers to be designed for optimum efficiency at the gain level corresponding to the contribution which they can make to the overall gain.

Preferably, at least one of the selectable amplifiers has a different output rating to the other(s). This allows greater flexibility, for a given number of selectable amplifiers, to be achieved in terms of the overall system gain. The output ratings of the selectable amplifiers may be arranged such that each is different and such that the output ratings of the selectable amplifiers comprise a sequence wherein each successive output rating is twice the preceding one. This affords yet greater flexibility in terms of overall gain for a given number of selectable amplifiers, and provides that the selectable amplifiers can be operated by a digital, binary input.

In the preferred embodiment, the control means drives the switches by means of such a digital signal. The digital signal may be either the digitised, detected envelope of the input signal or it may be the input signal itself, where the input signal is a digital, baseband signal destined for modulation. Each bit of the digitised signal may be used to control a respective switch in the operation of a corresponding selectable amplifier. A digital feedback signal derived from the output of the amplifying arrangement may be used to adapt the operation of the switches to counter errors observed in the overall output.

The selectable amplifiers can be supplemented with an additional amplifying means arranged to also receive the input signal from the splitting means and provide an amplified signal to the combiner. The additional amplifying means may be included to reduce the complexity of the scheme by providing, in addition, sufficient selectable amplifiers to handle signals above a certain envelope threshold only. This means that the amplification is handled solely by the additional amplifying means when the envelope is below the threshold rather than by several selectable amplifiers. The input signal to the additional amplifying means may be modulated under the control of the control means (especially where the input signal to the splitting means is subject to amplitude limitation by a suitable device). Alternatively, the input to the additional amplifying means may be clipped by an appropriate device so that the additional amplifying means only operates on signals having an envelope up to the threshold value.

In a preferred embodiment, the input signal to the splitting means is amplitude-limited so that the version of the input signal supplied to the splitting means has a substantially constant amplitude. Amplitude variations may then be reintroduced to the scheme by using the control means to select certain of the selectable amplifiers (or modulate the input to the additional amplifying means, if included).

BRIEF DESCRIPTION OF THE DRAWINGS

By way of example only, certain embodiments of the invention will now be described with reference to the accompanying figures, in which.

DETAILED DESCRIPTION

Figure 1:
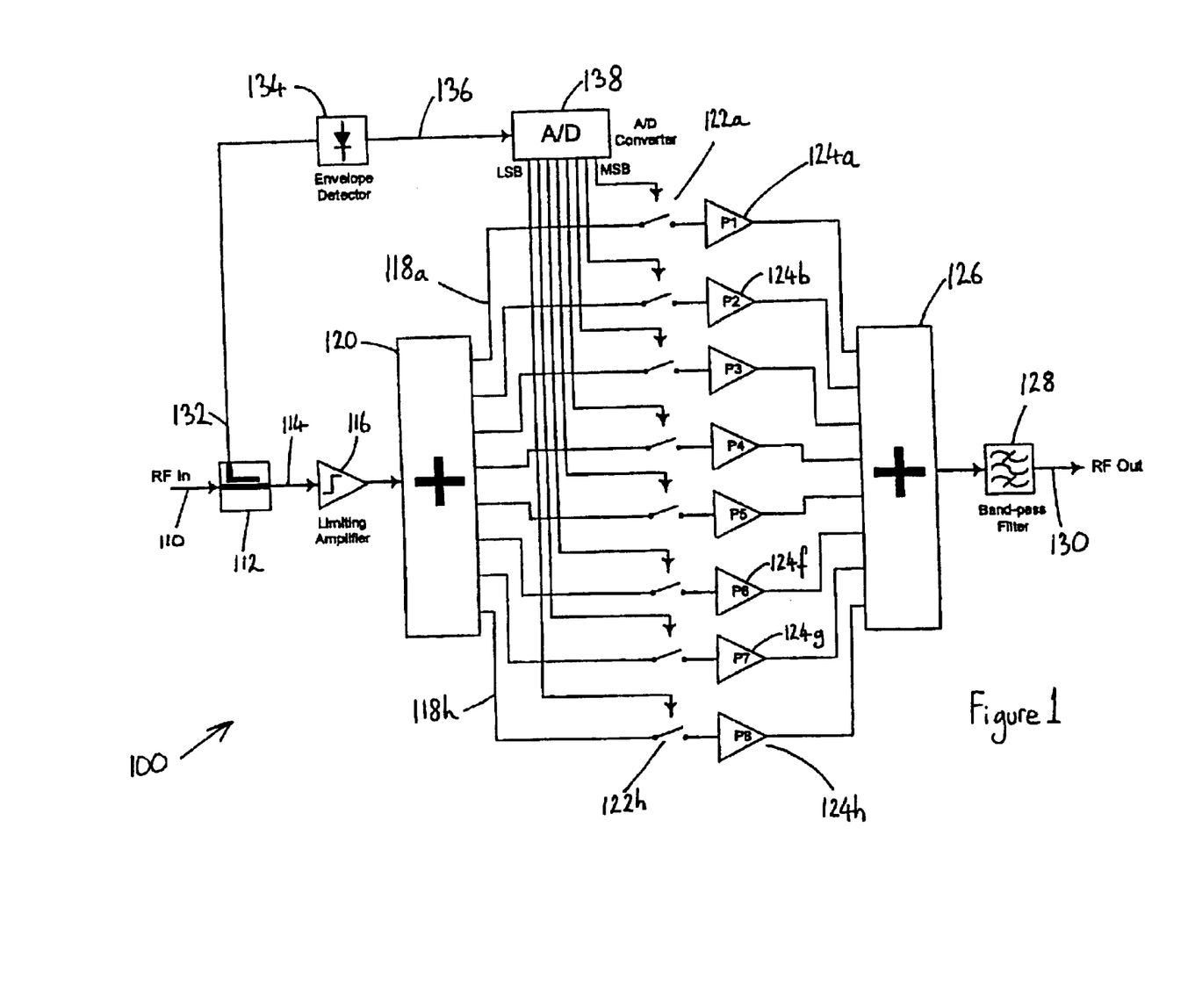
FIGS. 1 to 6 each illustrate a schematic diagram of a different amplifying scheme.

In the amplifying scheme 100 of FIG. 1, the input signal 110 destined for amplification is split by means of a coupler 112 (or splitter). One path 114 of the split signal feeds a limiting amplifier 116 which removes the amplitude variations present on the signal, but leaves any phase or frequency modulation unchanged. The signal from the limiting amplifier 116 is then split between a number of paths 118A to 118H by splitter 120.

The number of these paths 118A to 118H determines the resolution of the system. For example, in the amplifying scheme 100 there are eight paths 118A to 118H, corresponding to an eight bit system. The paths 118A to 118H each feed a respective RF switch 122A to 122H, for example, implemented using PIN diode technology. Each of the switches 122A to 122H selectively supplies a signal from splitter 120 to a respective power amplifier 124A to 124H. The outputs of the amplifiers 124A to 124H are then coherently combined by a low-loss high-power output combiner 126 such as is conventionally used to combine the outputs of multiple amplifying modules in existing power amplifier designs. The output of combiner 126 is bandpass filtered at 128 to eliminate alias products and transmits the high-power RF output signal 130.

The second path 132 of the split input signal 110 produced by coupler 112 is fed to detector 134 which detects the modulation envelope of the RF input signal 110. The signal 136 produced by detector 134 and indicative of the envelope of the input signal 110 is digitised by ADC 138. The resulting bits comprising the word representing signal 136 in the digital domain are used to switch the RF switches 122A to 122H in order to restore the envelope of the signal to the constant-envelope signals conveyed on paths 118A to 118H using amplifiers 124A to 124H. For example, the most significant bit (MSB) is used to drive switch 122A and the least significant bit (LSB) is used to drive switch 122H. Due to the action of switches 122A to 122H, each of the amplifiers 124A to 124H will either receive no input signal or will be required to provide a full power output signal. Each of the amplifiers 124A to 124H is therefore operating at its optimum efficiency and may be designed to be a non-linear amplifier (e.g. class-D or E).

The amplifiers 124A to 124H are designed so that their output power ratings form an appropriate "binary" series in order to allow the envelope variations of the input signal to be fully reconstructed in the output signal (provided that the input signal has been sampled at a minimum of the Nyquist rate for the envelope information being processed). For example, the output power rating of amplifier 124G is twice that of amplifier 124H, that of amplifier 124F is twice that of amplifier 124G, and so on until amplifier 124A is reached, which has an output rating twice that of amplifier 124B and 128 times the output rating of amplifier 124H. The bandpass filter 128 will remove any alias products created by the sampling process performed by ADC 138 and hence the output 130 is an accurate recreation of the RF spectrum.

The amplifying scheme 100 can be modified in many ways. For example, it may be implemented as a digital input/RF output system (as will be described later with reference to FIG. 4) or as an analogue, baseband input/RF output system. Although a polar coordinate implementation is used in scheme 100 (i.e. phase and amplitude modulation is applied to the carrier), it is also possible to implement a Cartesian version using inphase (I) and quadrature (Q) components to represent the input signal, although this will reintroduce combiner losses due to the image cancellation requirement. It would also involve two switched amplifier arrays, one for each of the I and Q components, thus roughly doubling the complexity of the system. Further, it will be apparent that the resolution of the system is arbitrary and depends upon the number of power amplifiers 124A to 124H and the number of bits comprising the digital word produced by ADC 138 to represent the envelope signal 136. Clearly, the number of bits of the ADC and the number of respective amplifiers 124A to 124H may be increased or decreased from the 8 shown in FIG. 1.

Components carried across from FIG. 1 to the amplifying schemes of FIGS. 2 to 6 will retain the same reference numerals and their functions will not be described again in detail during the following discussion.

Figure 2:
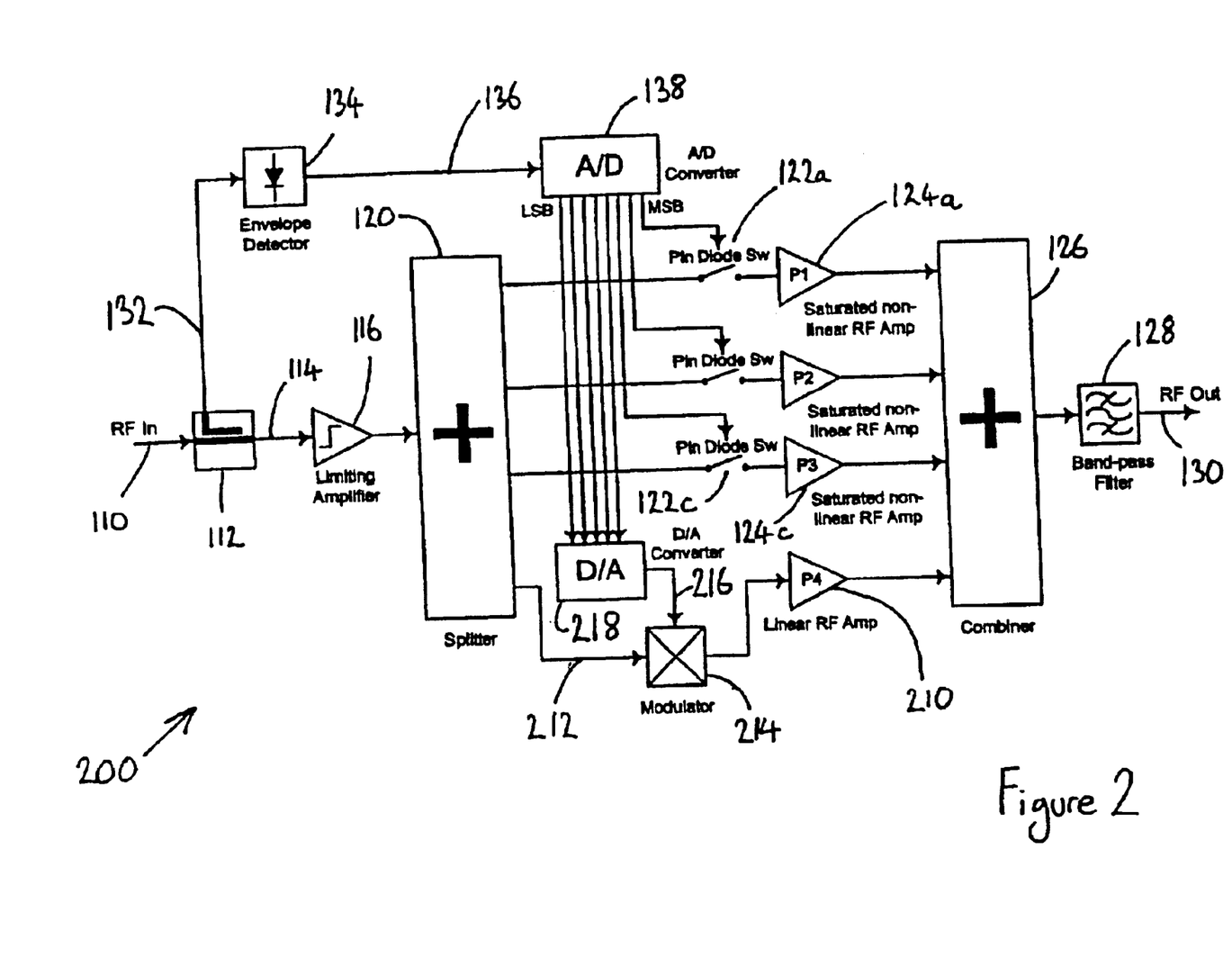

A modified version 200 of scheme 100 is shown in FIG. 2. The scheme 200 recognises the fact that the majority of power wastage of importance is in the very high power parts of a signal. Therefore, it is only these parts which need to be implemented efficiently, whilst the low power parts may be implemented using a conventional linear amplifier 210 of limited efficiency. In effect, amplifier 210 replaces amplifiers 124D to 124H of FIG. 1 which deal with the low power part of the signal. At low power levels, such that the high power, non-linear amplifiers 124A to 124D are not activated by the three most significant bits of the signal from ADC 138 (which means that the digital value produced by the ADC is relatively low), then the medium power, linear amplifier 210 functions alone. The envelope information is restored to the constant-envelope signal 212 destined for amplifier 210 by modulator 214. The modulation signal 216 applied to signal 212 is derived by DAC 218 from the five least significant bits of the digital envelope word produced by ADC 138. At higher power levels, the amplifiers 124A to 124C will be operated under the control of switches 122A to 122C using the three most significant bits of the digital envelope word as previously discussed with reference to FIG. 1.

The scheme 200 is considerably simpler than scheme 100, whilst still maintaining close to the same efficiency (and may even provide better efficiency in some circumstances due to the higher losses in many-way combiners).

Figure 3:
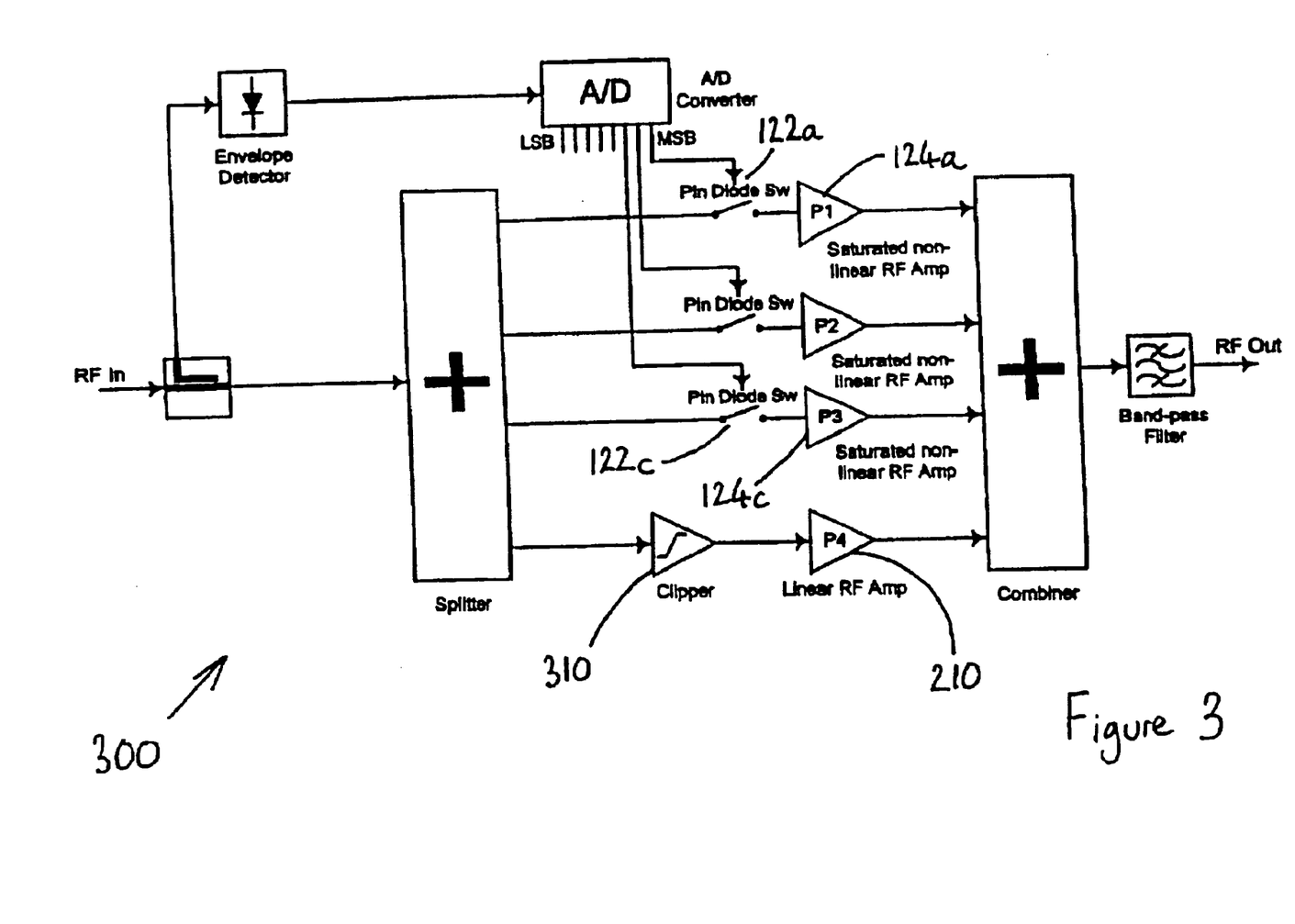

In the amplifying scheme 300 of FIG. 3, the limiting amplifier 116 of FIGS. 1 and 2 has been omitted. This provides a number of advantages due to the performance of the limiting amplifier (and indeed the whole system) at low envelope levels.

Generally, the scheme 300 operates as described in relation to scheme 200 except that the unlimited input signal feeding linear amplifier 210 no longer requires remodulation (modulator 214 in FIG. 2) as the amplitude modulation has not been eliminated. Linear amplifier 210 merely requires clipping instead. This clipping could be provided by the natural saturation of the RF linear amplifier 210, but it is best provided by a purpose designed clipper 310 since this will have a more ideal characteristic.

The non-linear amplifiers 124A to 124C in scheme 300 may now be viewed as serving to boost the output signal at signal peaks (above the threshold of clipper 310) by adding discrete "packets" of output power, thus restoring the envelope peaks. The amplifiers 124A to 124C may be aided by providing limiters at their inputs (not shown) but will not generally require assistance with this function, due to their highly non-linear nature.

Figure 4:
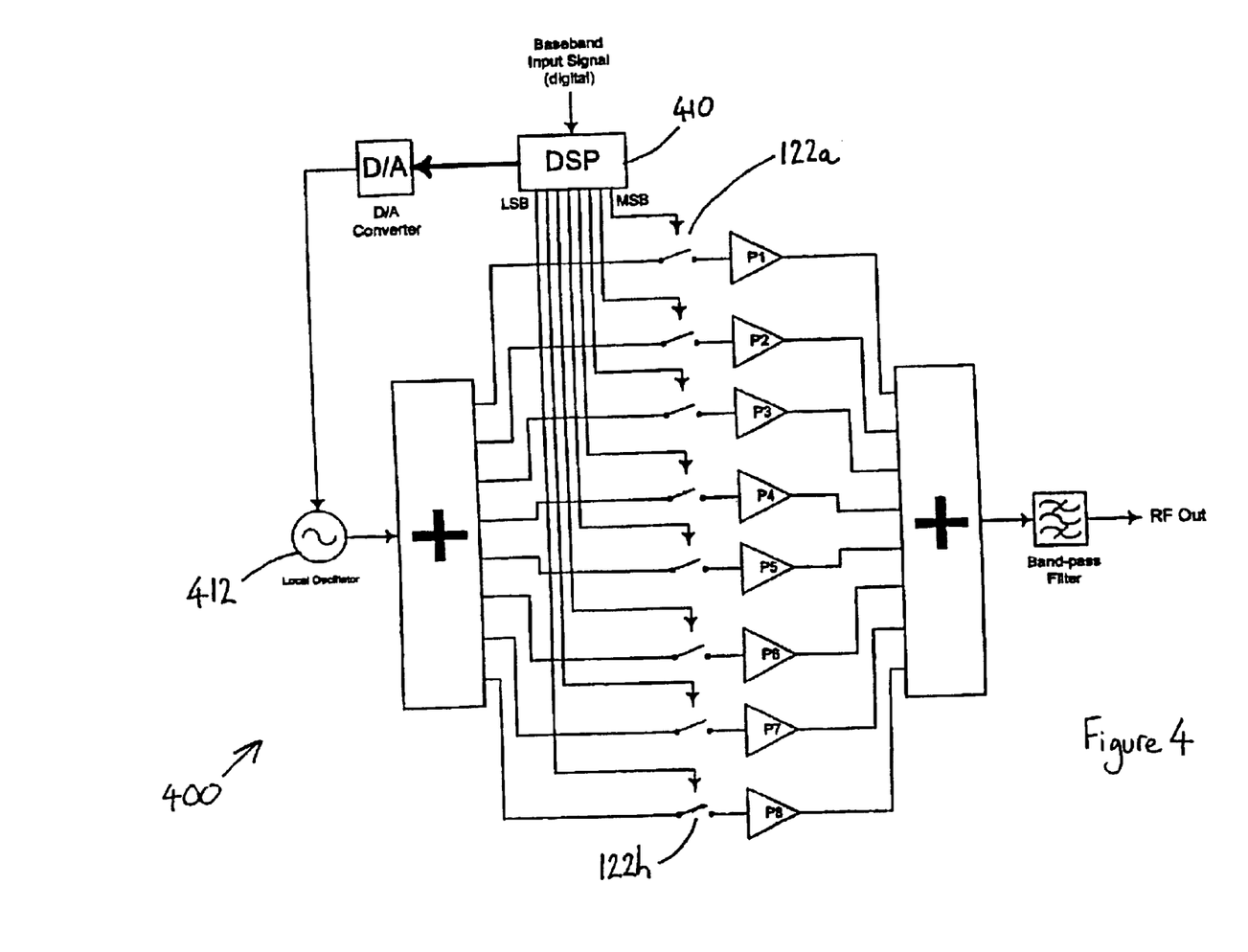

As mentioned above, it is possible to produce a digital-input/RF-output version of the system and this eliminates the requirement for an ADC (138 in FIG. 1). Such a system 400 is shown in FIG. 4. The digital signal processor (DSP) 410 now supplies both the envelope information and the phase modulating information to, in this case, an on-frequency local oscillator 412 operating at the channel (or band) centre frequency. The DSP 410 also supplies the envelope information directly to the PIN diode switches 122A to 122H. In other respects, scheme 400 operates like scheme 100. Clearly, it is possible to modify the other amplification schemes described herein to the digital input/RF-output format.

Feedback control can be utilised in conjunction with the schemes disclosed herein. The main sources of error in the basic system are in the power output accuracy of the power amplifiers 124A to 124H and the errors introduced by the output power combiner 126 under a range of possible operational conditions (for example, different combinations of amplifiers 124A to 124H being in operation or shutdown).

Figure 5:
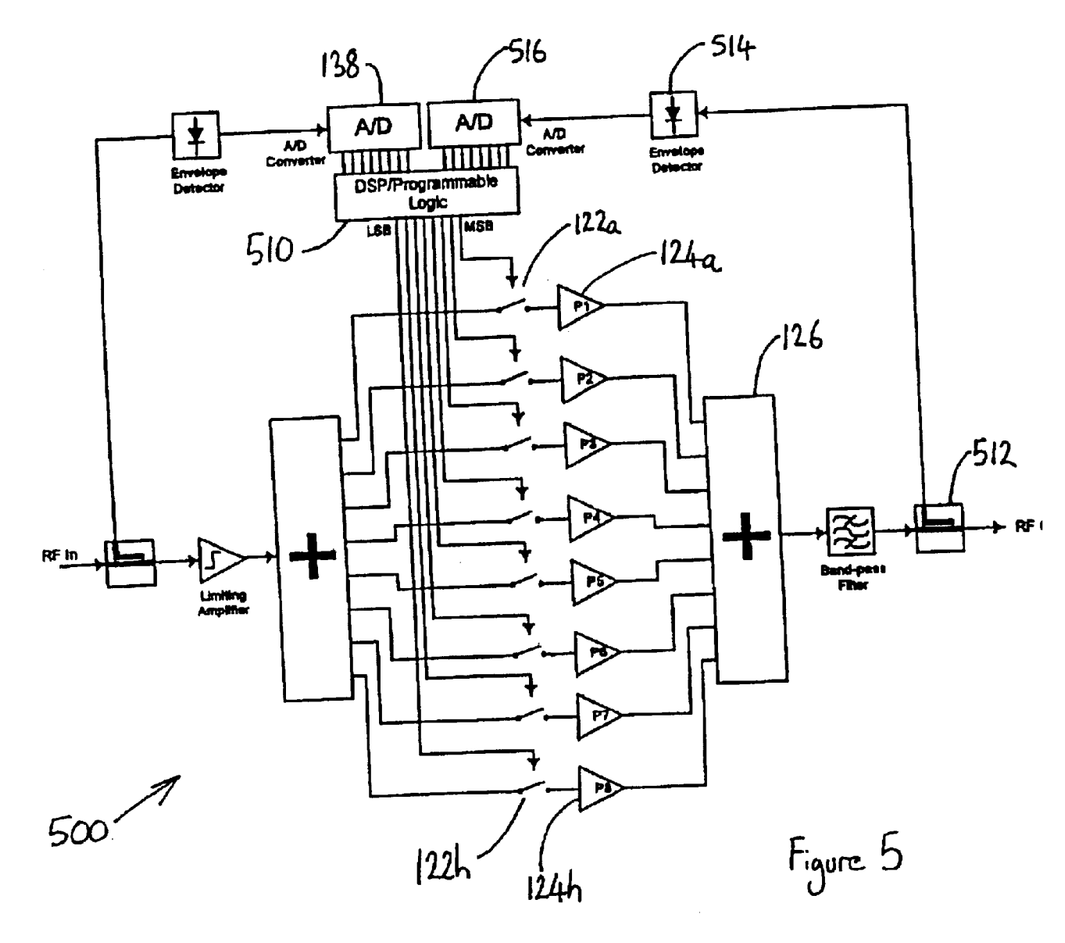

The amplifying scheme 500 shown in FIG. 5 is based on scheme 100 but incorporates an appropriate feedback signal. In scheme 500, the digital envelope word from ADC 138 is not supplied directly to switches 122A to 122H, but rather to DSP (or other programmable logic) 510. DSP 510 also receives a digital word indicative of the envelope of the amplified output signal. This digital output envelope signal is provided by output sampler 512, envelope detector 514 and ADC 516 in a manner analogous to the process producing the digital input envelope signal. Where the input and output signals are broadband, the digitisation of the output signal and hence the feedback mechanism cannot operate in real time, due to the delay through the path through the splitter 112 to container 126. This delay would cause the feedback arrangement to become unstable, with any reasonable level of loop gain, over the broad bandwidth which would be required in a broadband system. The delay in the digital parts of the feedback process would also add to this problem. The feedback mechanism must be a "sampling" system in which occasional snap shots of the output are considered, with the results being applied until the succeeding update.

The DSP contains a mapping function which maps the input envelope word bits to the switch control outputs under the control of the bits of the output envelope word. If the amplifiers 124A to 124H and the combiner 126 were perfect, this mapping would simply be to transfer each of the input envelope word bits directly to their corresponding switches 122A to 122H. However, if the output power of one of the amplifiers (say 124A) had drifted such that it now gave an output power equivalent to its required value minus the value of the least significant bit amplifier power (i.e. 124A minus 124H, say) then the comparator/latching function within the programmable logic would identify this error and the DSP could then take appropriate action, in this case generating a programmable logic function which would automatically set the LSB output to "1" whenever the bit for P1 was set.

The output of the amplifying scheme may be checked periodically to compensate for on-going temperature changes in the amplifiers 124A to 124H, with the mapping function being updated as necessary.

In a variation of scheme 500 handling narrow band signals, the output signal is digitised in real time to provide the digital output envelope signal. This signal is then used to address a look-up table containing data for modifying the switch control outputs. Hence, the amplifying scheme can compensate for errors in real time in a continuous manner.

Figure 6:
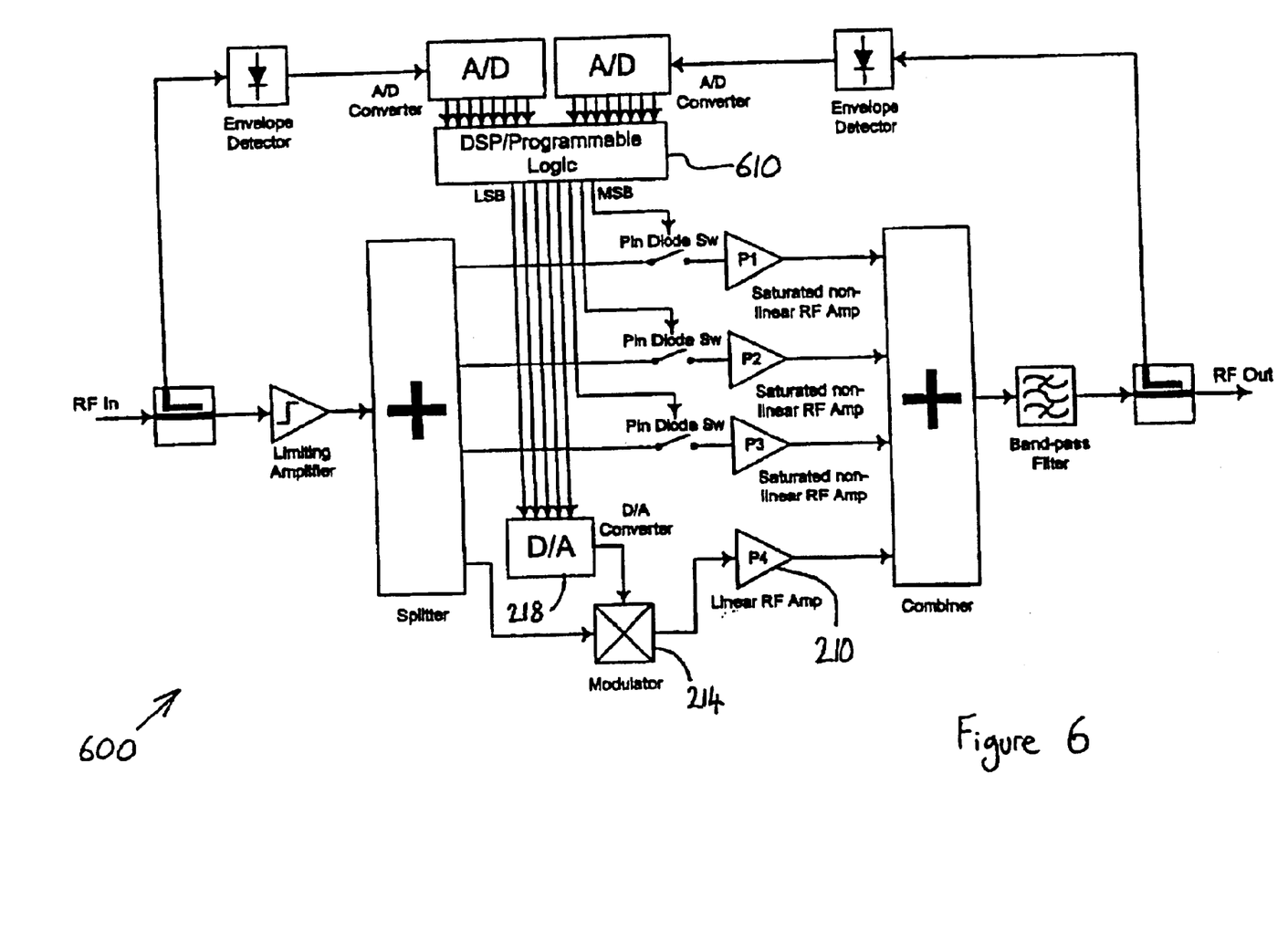

The amplifying scheme 600 of FIG. 6 illustrates the application of feedback correction to the scheme of FIG. 2. DSP 610 functions in the manner described with reference to FIG. 5. However, the mapping function now feeds the DAC 218 driving modulator 214. This approach assumes that the maximum power output error in any of the non-linear amplifiers 124A to 124C is significantly less than the maximum output power capability of the linear power amplifier 210.

What is claimed is:

1. Apparatus for amplifying an amplitude and phase/frequency modulated input signal to produce an output signal, comprising:

a splitter adapted to provide the input signal to at least one selectable amplifier and to an additional amplifier, a respective switch for each selectable amplifier, a detector adapted to detect the envelope of the input signal prior to amplification by any of the selectable and additional amplifiers, a controller adapted to control the operation of the switch or switches according to the envelope of the input signal, and a combiner adapted to combine the amplifier outputs, wherein:
   the additional amplifier is always connected to the splitter for receiving the input signal and
   each selectable amplifier is connected to the splitter for receiving the input signal via its respective switch.

2. Apparatus according to claim 1, wherein:
   a digital signal indicative of the envelope of the input signal is used to control the switch or switches and
   the controller is arranged to associate at least one bit of the digital envelope signal with a respective switch and to use the state of the bit to operate the switch.

3. Apparatus according to claim 2, wherein the controller comprises:
   a converter adapted to produce the digital envelope signal by converting the detected envelope into a digital signal.

4. Apparatus according to claim 2, further comprising a converter adapted to provide a feedback signal by digitising the envelope of the output signal, wherein the controller is arranged to use the bits of the digitised output envelope to adapt the operation of the switch or switches.

5. Apparatus according to claim 1, wherein the additional amplifier is a linear amplifier.

6. Apparatus according to claim 1, further comprising a modulator adapted to modulate the input signal before it is received by the additional amplifier.

7. Apparatus according to claim 6, wherein the controller is arranged to adjust the modulation applied by the modulator.

8. Apparatus according to claim 6, wherein bits of a digital signal indicative of the envelope of the input signal are used to modulate the input signal received by the additional amplifier.

9. Apparatus according to claim 6, wherein bits of a digital signal indicative of the envelope of the output signal are used to modulate the input signal received by the additional amplifier.

10. Apparatus according to claim 1, further comprising a clipper adapted to clip the input signal received by the additional amplifier.

11. Apparatus according to claim 1, wherein there is a plurality of selectable amplifiers and at least one of the selectable amplifiers has a different output power rating to the other or others.

12. Apparatus according to claim 7, wherein the output power ratings of the selectable amplifiers are each different and comprise a sequence wherein each successive output rating is twice the preceding one.

13. Apparatus according to claim 1, further comprising a limiter adapted to limit the amplitude of the input signal supplied to the splitter.

14. Apparatus according to claim 1, further comprising a filter arranged to reject undesired components of the combiner output.

15. A method of amplifying an amplitude and phase/frequency modulated input signal to produce an output signal, the method comprising providing the input signal to at least one selectable amplifier and to an additional amplifier, wherein the input signal is always provided to the additional amplifier, the input signal is provided to each selectable amplifier via a respective switch and the method further comprises detecting the envelope of the input signal prior to amplification by any of the selectable and additional amplifiers, controlling the operation of the switch or switches according to the envelope of the input signal, and combining the outputs of the amplifiers.

16. Apparatus according to claim 6, wherein the modulator is connected between the splitter and the additional amplifier to modulate only the copy of the input signal being provided to the additional amplifier.

17. Apparatus for amplifying a digital input signal to produce an output signal, comprising:
   a controller adapted to process the digital input signal;
   a digital-to-analog (D/A) converter adapted to convert a first digital signal from the controller into an analog signal;
   a modulator adapted to generate a modulated analog signal based on the analog signal from the DIA converter;
   at least two selectable amplifiers;
   a splitter adapted to provide the modulated analog signal to each selectable amplifier;
   a respective switch for each selectable amplifier, wherein:
      each selectable amplifier is connected to the splitter for receiving the modulated analog signal via its respective switch; and
      the controller is further adapted to control the operation of the different switches according to different bits of a second digital signal from the controller; and
   a combiner adapted to combine the amplifier outputs to generate the output signal.

18. Apparatus for amplifying an input signal to produce an output signal, comprising:
   at least two selectable amplifiers;
   a splitter adapted to provide the input signal to each selectable amplifier;
   a respective switch for each selectable amplifier, wherein each selectable amplifier is connected to the splitter for receiving the input signal via its respective switch;
   a combiner adapted to combine the amplifier outputs to generate the output signal; and
   a controller adapted to control the operation of the switches according to both the envelope of the input signal and the envelope of the output signal.

19. Apparatus for amplifying an amplitude and phase/frequency modulated input signal to produce an output signal, comprising:
   a splitter adapted to provide the input signal to at least one selectable amplifier and to an additional amplifier,
   a respective switch for each selectable amplifier,
   a controller adapted to control the operation of the switch or switches according to the envelope of the input signal, and
   a combiner adapted to combine the amplifier outputs, wherein:
      the additional amplifier is always connected to the splitter for receiving the input signal,
      each selectable amplifier is connected to the splitter for receiving the input signal via its respective switch,
      a digital signal indicative of the envelope of the input signal is used to control the switch or switches, and
      the controller is arranged to associate at least one bit of the digital envelope signal with a respective switch and to use the state of the bit to operate the switch.

20. Apparatus according to claim 19, wherein the input signal is a digital, baseband signal and provides the digital envelope signal directly.

21. Apparatus according to claim 20, further comprising:
   a converter adapted to convert the input signal into an analogue signal, and
   a modulator adapted to modulate the analogue input signal on to a carrier signal to produce an analogue, up-converted input signal, wherein the analogue, up-converted input signal is supplied to the splitter.

22. Apparatus according to claim 19, further comprising:
   a detector adapted to detect the envelope of the input signal, and
   a converter adapted to produce the digital envelope signal by converting the detected envelope into a digital signal.

23. Apparatus according to claim 19, further comprising a converter adapted to provide a feedback signal by digitising the envelope of the output signal, wherein the controller is arranged to use the bits of the digitised output envelope to adapt the operation of the switch or switches.

24. Apparatus for amplifying an amplitude and phase/frequency modulated input signal to produce an output signal, comprising:
   a splitter adapted to provide the input signal to at least one selectable amplifier and to an additional amplifier,
   a respective switch for each selectable amplifier,
   a controller adapted to control the operation of the switch or switches according to the envelope of the input signal,
   a combiner adapted to combine the amplifier outputs, wherein:
      the additional amplifier is always connected to the splitter for receiving the input signal and
      each selectable amplifier is connected to the splitter for receiving the input signal via its respective switch, and
   a modulator adapted to modulate the input signal before it is received by the additional amplifier, wherein the modulator is connected between the splitter and the additional amplifier to modulate only the copy of the input signal being provided to the additional amplifier.

25. Apparatus according to claim 24, wherein the controller is arranged to adjust the modulation applied by the modulator.

26. Apparatus according to claim 24, wherein bits of a digital signal indicative of the envelope of the input signal are used to modulate the input signal received by the additional amplifier.

27. Apparatus according to claim 24, wherein bits of a digital signal indicative of the envelope of the output signal are used to modulate the input signal received by the additional amplifier.

* * * * *